(12) United States Patent
Chung et al.

(10) Patent No.: US 9,887,110 B2
(45) Date of Patent: Feb. 6, 2018

(54) SUBSTRATE WARPAGE CONTROL USING TEMPER GLASS WITH UNI-DIRECTIONAL HEATING

(71) Applicant: INTEL CORPORATION, Santa Clara, CA (US)

(72) Inventors: Chee Key Chung, Taipei (TW); Takashi Shuto, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/767,508

(22) PCT Filed: Sep. 27, 2014

(86) PCT No.: PCT/US2014/057921
§ 371 (c)(1),
(2) Date: Aug. 12, 2015

(87) PCT Pub. No.: WO2016/048383
PCT Pub. Date: Mar. 31, 2016

(65) Prior Publication Data
US 2016/0268149 A1    Sep. 15, 2016

(51) Int. Cl.
*H01L 21/00* (2006.01)
*H01L 21/67* (2006.01)
(Continued)

(52) U.S. Cl.
CPC .... *H01L 21/67092* (2013.01); *H01L 21/4846* (2013.01); *H01L 21/67098* (2013.01);
(Continued)

(58) Field of Classification Search
None
See application file for complete search history.

(56) References Cited

U.S. PATENT DOCUMENTS

2005/0136567 A1   6/2005  Yuan et al.
2005/0212154 A1*  9/2005  Inoue ................... B29C 43/361
                                                          264/1.32
(Continued)

FOREIGN PATENT DOCUMENTS

JP    1980053484    4/1980
JP    6244242       9/1994
(Continued)

OTHER PUBLICATIONS

Fujii et al., JP-1980053484, English language machine translation, 1980, pp. 1-4.*

(Continued)

*Primary Examiner* — Angel Roman
(74) *Attorney, Agent, or Firm* — Schwabe, Williamson & Wyatt, P.C.

(57) ABSTRACT

A method including clamping an integrated circuit package substrate between first and second supporting substrates; exposing the clamped package substrate to a heat source from a single direction; and modifying a shape of the package substrate. An apparatus including a first and second supporting substrates, the first supporting substrate including a two-dimensional area that is 75 percent to 95 percent of the area of the first side of the package substrate and the second supporting substrate including a two-dimensional area that is at least equivalent to the area of a package substrate and each of the first supporting substrate and the second supporting substrate include a body having a cavity therein such that when assembled on opposite sides of a package substrate, each cavity has a volume dimension such that the body of the supporting substrate is not in contact with an area of a package substrate.

20 Claims, 3 Drawing Sheets

(51) Int. Cl.
  *H01L 21/48* (2006.01)
  *H01L 21/687* (2006.01)
  *H01L 21/324* (2006.01)
  *H01L 23/498* (2006.01)

(52) U.S. Cl.
  CPC .. *H01L 21/68721* (2013.01); *H01L 21/68785* (2013.01); *H01L 21/3247* (2013.01); *H01L 23/49811* (2013.01); *H01L 23/49816* (2013.01); *H01L 2924/0002* (2013.01)

(56) References Cited

U.S. PATENT DOCUMENTS

| | | | |
|---|---|---|---|
| 2009/0084585 A1* | 4/2009 | Matsumoto | H01L 23/13 174/255 |
| 2010/0020503 A1 | 1/2010 | Beaumier et al. | |
| 2011/0037156 A1 | 2/2011 | Chandrasekaran et al. | |
| 2012/0040500 A1* | 2/2012 | Lin | H01L 21/561 438/127 |
| 2013/0260535 A1 | 10/2013 | Chen et al. | |
| 2013/0303053 A1* | 11/2013 | Mase | B24C 1/045 451/31 |
| 2014/0242729 A1 | 8/2014 | Mannen et al. | |
| 2015/0004726 A1* | 1/2015 | Konishi | H01L 33/501 438/27 |

FOREIGN PATENT DOCUMENTS

| | | |
|---|---|---|
| JP | 2009081358 | 4/2009 |
| JP | 2011/192781 | 9/2011 |
| KR | 20100005646 | 6/2010 |
| WO | WO-9749127 | 12/1997 |

OTHER PUBLICATIONS

Rai, JP-6244242, English language machine translation, 1994, pp. 1-12.*
PCT Search Report and Written Opinion for Int. application No. PCT/US2014/057921 dated Jun. 26, 2015.
Intel Corporation, "Office action with search report", TW Application No. 104127919, (Aug. 31, 2016).
Intel Corporation, "Notice of Preliminary Rejection", KR Application No. 2015-7023153, (Jun. 17, 2016).
Intel Corporation, "First Office Action", JP Application No. 2016-550463, (dated Dec. 26, 2016).
Intel Corporation, "Extended European Search Report", EP Application No. 14882785, (dated Mar. 22, 2017).
Intel Corporation, "International Preliminary Report on Patentability and Written Opinion", International Application No. PCT/US2014/057921, (dated Mar. 28, 2017).
Intel Corporation, "Notice of Preliminary Rejection", KR Application No. 2015-7023153, (dated Mar. 3, 2017).

* cited by examiner

SUBSTRATE WARPAGE CONTROL USING TEMPER GLASS WITH UNI-DIRECTIONAL HEATING

CROSS-REFERENCE TO RELATED APPLICATION

This patent application is a U.S. National Phase Application under 35 U.S.C. §371 of International Application No. PCT/US2014/057921, filed Sep. 27, 2014, entitled SUBSTRATE WARPAGE CONTROL USING TEMPER GLASS WITH UNI-DIRECTIONAL HEATING.

BACKGROUND

Field

Integrated circuit package substrate.

Description of Related Art

An integrated circuit package package provides a number of functions for an integrated circuit chip including delivering power to the chip, transferring information into and out of the chip, dissipating heat and protecting the chip from physical and/or environmental damage. To the extent that the package substrate is damaged or defective, one or more of these functions can be impacted.

A typical chip package substrate includes a core substrate of a resin material having a thickness currently on the order of approximately 400 microns (μm) and below. The buildup layers of a dielectric material such as ABF insulating conductive routing layers to contact points on a surface of a package substrate for connection to an integrated circuit chip (a device side of the package substrate) and, representatively, routing layers to contact points on a back side of the package substrate for passive devices such as resistors and capacitors and to contact points for connection of the package substrate to another substrate such as a printed circuit board on an opposite side of the package substrate.

During the manufacturing of a package substrate, the package substrate can experience warpage. Excess convex warpage on a device side of a package substrate (curved outward) can cause open solder joint failure during reflow soldering to connect a chip to the package substrate. As substrate cores become thinner, a concern of warpage increases.

DETAILED DESCRIPTION

A method is described that, in one embodiment, can reduce dynamic and static warpage of a substrate such as a package substrate. Representatively, the method includes clamping an integrated circuit package substrate between a first supporting substrate and a second supporting substrate. The clamped package substrate is exposed to a heat source from a single direction. Such uni-directional heat exposure will have a tendency to modify a shape of the package substrate. A device side surface of a package substrate with a random shape, a saddle shape or a generally convex shape may be modified to a generally planar or slightly concave shape to improve a connection of an integrated circuit chip thereto. Similarly, a device side surface of a package substrate with a generally planar surface may similarly be modified to a slightly concave shape to improve a connection of a chip thereto. An assembly operable to, in one embodiment, support a package substrate for a uni-directional heat treatment is also described.

Figure 1:
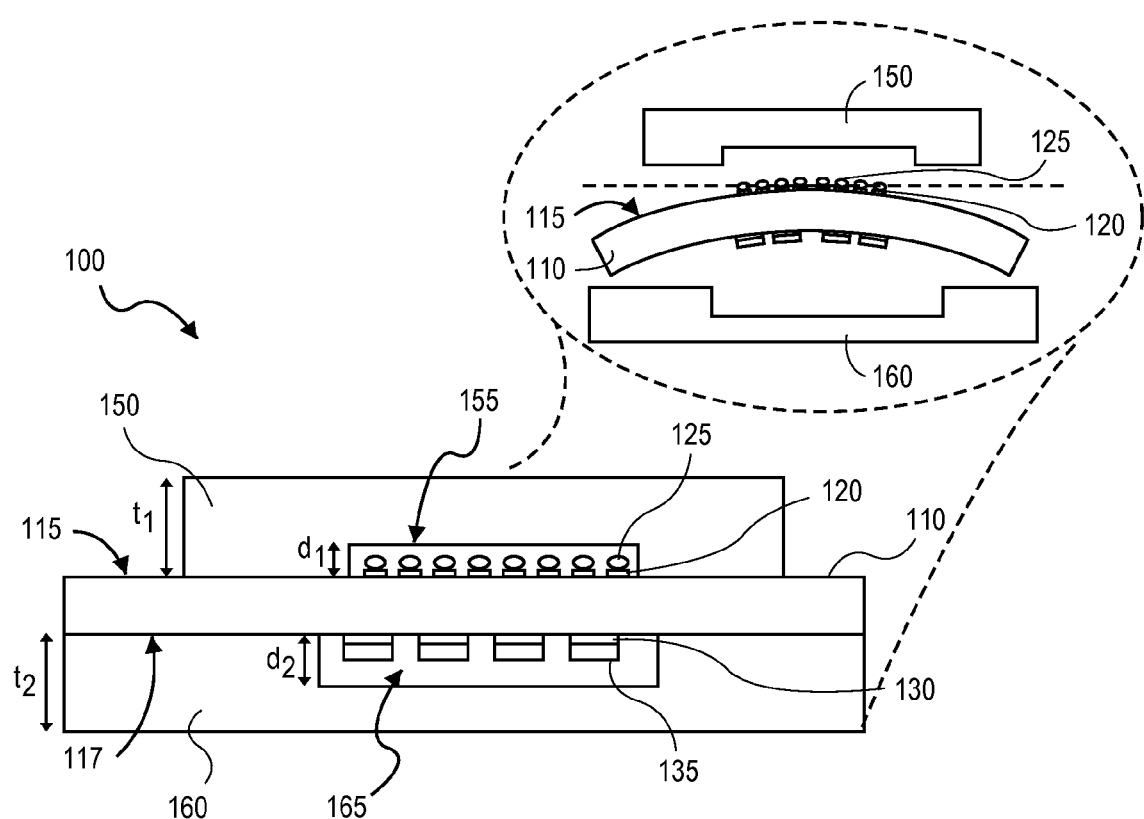
FIG. 1 shows a schematic side view of an assembly including a package substrate disposed between a first supporting substrate and a second supporting substrate.

FIG. 1 shows an embodiment of an assembly. Assembly 100 includes an integrated circuit package substrate disposed between a first supporting substrate and a second supporting substrate. In one embodiment, package substrate 110 includes a core of a resin material having a thickness on the order of about 400 μm and below, a coefficient of thermal expansion of five to seven parts per million (ppm) per degree Celsius, a glass transition temperature (Tg) of 295° C. TMA/260° C. DMA, and a Young's modulus of 32 gigapascals (GPA) at room temperature and 19 GPA at high temperature. Overlying the core of package substrate on a device side (device side 115) are one or more routing layers insulated by a dielectric material (e.g., ABF). Such routing layers are connected to contact points 120 on a surface of the package substrate operable for connection of an integrated circuit chip or die to package substrate 110. Disposed on contact points 120, in one embodiment, are solder bumps of, for example, a lead free solder alloy such as a tin alloy. Overlying the core on a side opposite device side (a back side) are one or more routing layers insulated by a dielectric material (e.g., ABF). Such routing layers are connected to contact points 130 on a surface of the package substrate operable for connection of one or more passive devices such as capacitors and/or resistors. FIG. 1 shows contact points 130 on back side 117 of package substrate 110 and passive devices 135 connected thereto by way of, for example, a solder paste between contact points 130 and device 135 (by way of a surface mount technology process). In one embodiment, ones of such routing layers on a back side of the core are also connected to a pin grid array disposed on back side 117 of package substrate 110 to connect the package substrate to another substrate such as a printed circuit board.

Assembly 100 shows package substrate 110 disposed between first supporting substrate 150 and second supporting substrate 160. As illustrated, in this embodiment, first supporting substrate 150 is positioned on device side 115 of package substrate 110 and supporting substrate 160 is disposed on back side 117 of the substrate. Referring to supporting substrate 150, in one embodiment, supporting substrate 150 is formed of a material having a coefficient of thermal expansion less than a coefficient of thermal expansion of the core of package substrate 110. In one embodiment, a suitable material is tempered glass that has a coefficient of thermal expansion on the order of less than 5 ppm/K. In one embodiment, a body of supporting substrate 150 has a thickness, t, operable to bear the weight of package substrate 110.

Figure 2:
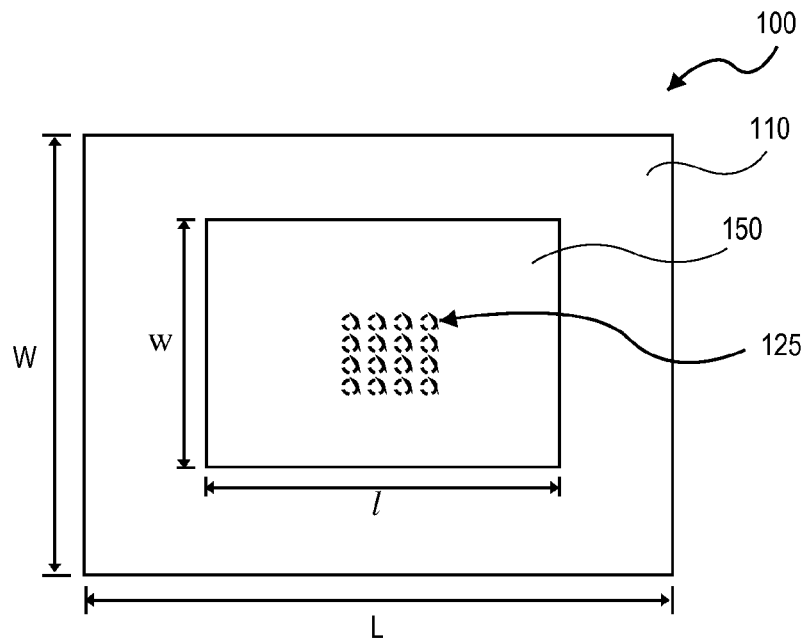
FIG. 2 shows a top view of the assembly of FIG. 1.

In one embodiment, a two-dimensional area of first supporting substrate 150 of assembly 100 is less than a two-dimensional area of substrate 110. FIG. 2 shows a top view of assembly 100 of FIG. 1 and shows first supporting substrate 150 having a length dimension, l, and width dimension, w, defining a two-dimensional area of first supporting substrate 150. In one embodiment, a two-dimensional area of first supporting substrate 150 is 75 percent to 90 percent of a two-dimensional area of package substrate 110 defined by length, L, and width, W.

Referring again to FIG. 1, in one embodiment, first supporting substrate 150 includes cavity 155 having a depth dimension, $d_1$, sufficient to avoid contact with contact points 120 and/or solder bumps 125 on such contact points. In one embodiment, its depth, $d_1$, is equal to a maximum solder bump height. In one embodiment, a two-dimensional area of cavity 155 relative to surface of device side 115 is limited to surround the array of contact points 120/solder bumps 125. In another embodiment, a two-dimensional area of cavity 155 may be larger than an area operable to surround the array.

Disposed on back side 117 of package substrate 110 of assembly 100 in FIG. 1 is second supporting substrate 160. In one embodiment, second supporting substrate 160 has length and width dimensions to define a two-dimensional area that is at least equivalent to a two-dimensional area of substrate 110. Representatively, second supporting substrate 160, in one embodiment, is a material similar to a material for first supporting substrate 150. Second supporting substrate 160 is a material that has a coefficient of thermal expansion less than a coefficient of thermal expansion of a core material of package substrate 110. Second supporting substrate 160 has a body having a thickness, $t_2$, selected, in one embodiment, to bear a weight of package substrate 110. In one embodiment, second supporting substrate 160 has cavity 165 formed therein. Cavity 165 has a volume defined by depth, $d_2$, being sufficient to avoid contact with contact points 130 and any passive devices or pins on back side 117 of package substrate 110. In one embodiment, cavity 165 has a depth, $d_2$, that is equal to the thickness of passive devices on contact points 130 plus device 135 a gap in a representative range of 50~100 microns.

In an embodiment where first supporting substrate 150 and second supporting substrate 160 are each tempered glass, the tempered glass, in one embodiment, is polished to avoid any press markings upon contact of the supporting substrate with package substrate 110. In one embodiment, a surface of first supporting substrate 150 and second supporting substrate 160 in contact with substrate 110 has a warpage/roughness of less than five microns.

A typical concern of package substrate warpage is where a shape of a package substrate when viewed from a device side is convex such that the sides of the package extends outward. In such instances, an array of contact points (contact points 120) on a device side (device side 115) of the package substrate is not coplanar. Referring to FIG. 1, where device side 115 of package substrate 110 faces upward, a convex shape of the package substrate means contact points on a periphery of the array of contact points will be below a plane of contact points in the center of the array (below contact points closer to a midpoint of the package substrate) as illustrated in the exploded inset view of assembly 100. A convex shape potentially leads to open solder joints on a device side of the package substrate because of an increased distance between the contact points of a package substrate particularly ones on a periphery of the array and the corresponding contact points of a die or chip to be attached thereto. In one embodiment, it is desired to produce a package substrate that has a shape with no warpage (all contact points 120 are coplanar or zero convex warpage). In another embodiment, it is acceptable to have a package substrate where the device side of the package substrate has a concave shape with warpage up to 30 microns in a concave direction.

Upon the die attach to the device side of a package substrate having a device side with slightly concave shape (e.g., up to 30 μm concave), the package substrate will have a tendency to modify its shape toward a minimum warpage.

Figure 3:
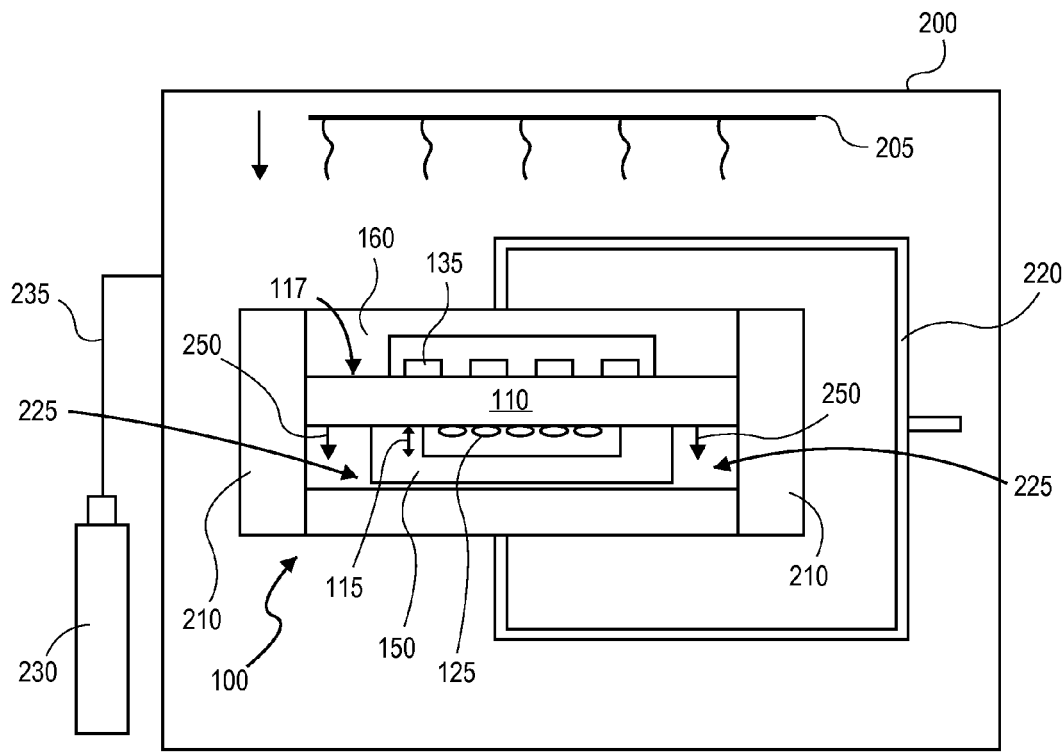
FIG. 3 shows the assembly of FIG. 1 disposed in a reflow oven.

FIG. 3 shows the assembly of FIG. 1 inverted and disposed inside a reflow oven. In one embodiment, oven 200 has heat source 205 to direct heat in one direction (downward as viewed). FIG. 3 shows assembly 100 disposed within jig 210 that is, for example, an aluminum jig having dimensions to support assembly 100 therein. FIG. 3 also shows clamp 220 having opposing arms operable to apply pressure to assembly 100.

In one embodiment, package substrate 110 has a shape including a convex warpage relative to device side 115. Such warpage is not evident in FIG. 1 or FIG. 3 due to the disposal of the package substrate between the supporting substrates. Referring to FIG. 3, substrate 110 within oven 200 would tend to have opposing sides that face upward toward heat source 205. Placing package substrate 110 in oven 200 and heating the oven from one direction (toward back side 117 as viewed), the heat would tend to directly contact substrate 110 on one side, in this case, back side 117 and cause such side to expand relative to device side 115. A shape of package substrate 110 would tend to be modified in the sense of warping away (in a direction indicated by arrow 250) from the heating side. The modification is aided by a two-dimensional area of first supporting substrate 150 being less than a two-dimensional area of package substrate 110, the difference producing gap 225 between the supporting substrate and jig 210. Thus, by using one directional heating, a shape may be modified in one direction and a convex shape relative to device side 115 of package substrate 110 can be modified to a target of, for example, zero to 30 microns concave.

In one embodiment, a method includes exposing package substrate 110 disposed between supporting substrates to heat from heat source 205 providing one-directional or uni-directional heating at a temperature above a glass transition temperature of solder bumps 125 on the package substrate but below a melting point of solder bumps 125. Representatively, a suitable temperature is on the order of 180° C. to 200° C. In another embodiment, a suitable temperature range is on the order of 180° C. to 250° C. Using a temperature on the order of 250° C. allows for a one time reflow process for passive devices 135 that are connected on back side 117 of package substrate 110. Representatively, exposure to the one directional heating may be for a time period sufficient to modify a shape of the package substrate. A suitable modification is a modification that achieves a shape of zero warpage (generally planar) to 30 microns toward a concave shape on device side 115 of package substrate 110. A suitable time period is on the order of one minute to 30 minutes.

In one embodiment, to inhibit oxidation of the contact points or solder material associated with package substrate 110, the exposure of package substrate 110 to a heat source is done in an environment with minimal oxygen therein. Representatively, oven 200 may include a nitrogen source connected thereto. Nitrogen source 230, in one embodiment, is operable to introduce nitrogen into oven 200 through conduit 235. In one embodiment, a method of exposing the package substrate to a heat source is done in an environment of nitrogen and less than 100 parts per million oxygen. Following the exposure of the package substrate to the heat source, the package substrate may be removed from oven 200, jig 210 and the supporting substrate.

The method described using one-directional (uni-directional) heating of a substrate between supporting substrates allows the production of package substrates with consistently acceptable planarity (and land co-planarity) or a device side surface with minimal concavity (e.g., 30 µm or less). The method may be employed for substrates that have been deemed non-usable because of a shape with unacceptable warpage (e.g., an overly convex shape on a device side of the package substrate) or may be employed as a regular practice in forming package substrate each to consistently achieve a desired planarity or a device side with a slightly concave shape (e.g., zero to 30 microns concave shape).

Figure 4:
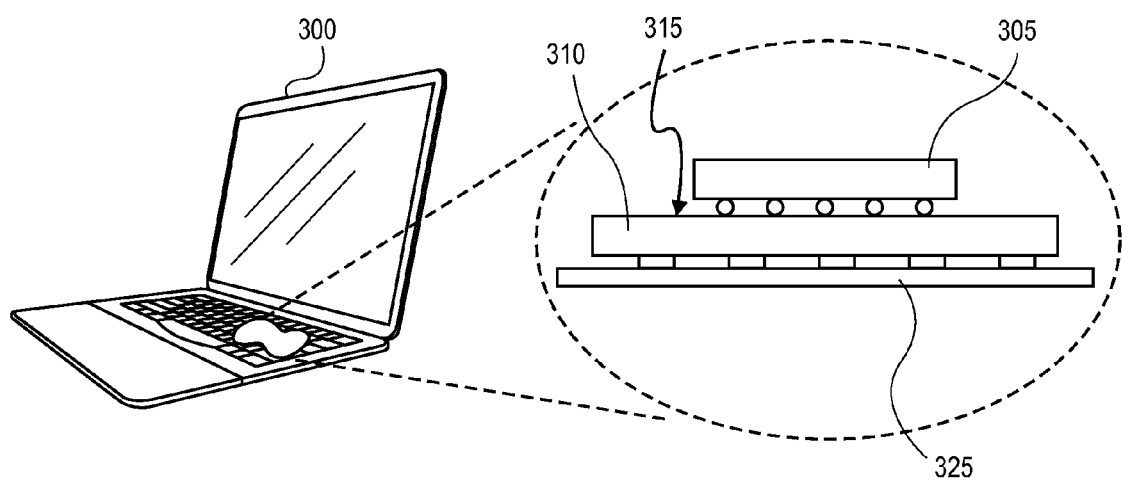
FIG. 4 is a mobile computer including a microprocessor encased in a package substrate.

FIG. 4 shows an embodiment of a computer assembly that, in this embodiment, is a mobile computer. Disposed within computer assembly 300 is a microprocessor connected to a package and the package connected to printed circuit board. Referring to FIG. 4, microprocessor 305 is connected to package substrate 310. Package substrate 310 is connected through, for example, a pin grid array on a back side thereof to printed circuit board 325. In one embodiment, a device side of package substrate 310 was prepared according to the method described above such that the assembled package (package substrate 310 and microprocessor 305) is generally planar such that solder connections between microprocessor 305 and the package substrate are landed.

Figure 5:
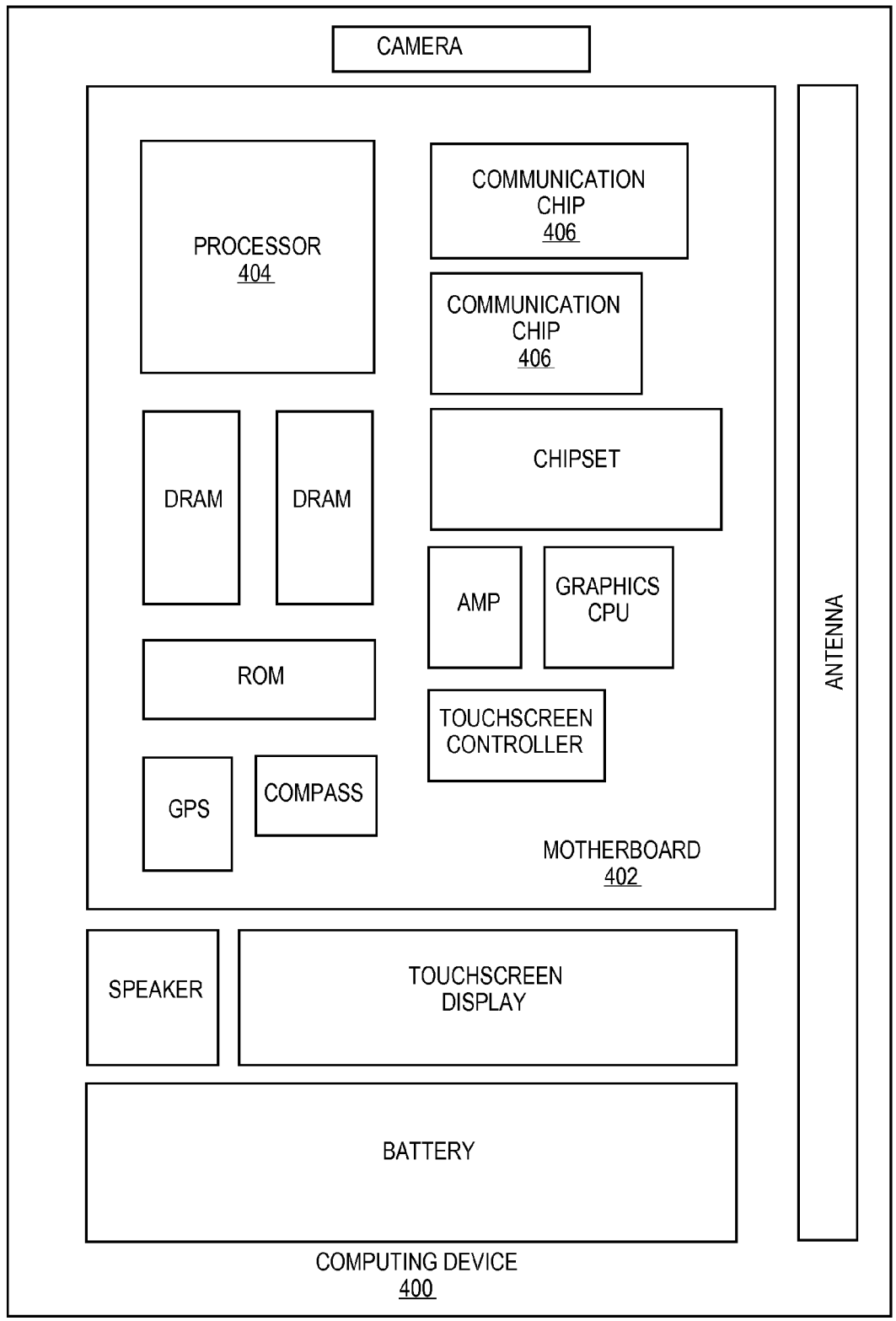
FIG. 5 shows an embodiment of a computing device.

FIG. 5 illustrates computing device 400 in accordance with one implementation. Computing device 400 houses board 402. Board 402 may include a number of components, including but not limited to processor 404 and at least one communication chip 406. Processor 404 is physically and electrically coupled to board 402. In some implementations at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, first communication chip 406 may be dedicated to shorter range wireless communications such as Wi-Fi and Bluetooth and second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, a package technology is employed including a package exposed to a uni-directional heat source as described above in a manner such as described above. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, a package technology is employed including a package exposed to a uni-directional heat source as described above in a manner such as described above.

In further implementations, another component housed within computing device 400 may contain an integrated circuit die in a package technology including a package exposed to a uni-directional heat source as described above in a manner such as described above In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

Example 1 is a method including clamping an integrated circuit package substrate between a first supporting substrate and a second supporting substrate; exposing the clamped package substrate to a heat source from a single direction; and modifying a shape of the package substrate.

In Example 2, the package substrate of the method of Example 1 includes a first side including a two-dimensional area and the first supporting substrate is clamped to the first side of the package substrate, the first supporting substrate including a two-dimensional area that is 75 percent to 95 percent of the area of the first side of the package substrate.

In Example 3, the single direction of the heat source of the method of Example 2 is a direction on the side of the first side of the package substrate.

In Example 4, the second supporting substrate of the method of Example 2 includes a two-dimensional area that is at least equivalent to the area of the package substrate.

In Example 5, the material of the first supporting substrate and the material of the second supporting substrate of the method of Example 1 is tempered glass.

In Example 6, the tempered glass of the method of Example 5 is polished.

In Example 7, the first side of the package substrate of the method of Example 1 includes a die area and, prior to modifying the shape, the first side of the package substrate has a convex shape.

In Example 8, modifying the shape of the method of Example 7 includes modifying the convex shape of the first side of the package substrate to a concave shape.

In Example 9, the package substrate of the method of any of Examples 1 or 2 includes exposed solder, and the method further includes exposing the clamped package substrate to a heat source in a reduced oxygen environment.

In Example 10, the heat source of the method of any of Examples 1 or 2 includes a heat source having a temperature of 180° C. to 250° C.

In Example 11, prior to exposing the clamped package substrate to a heat source, the method of Example 10 includes introducing a solder paste on a surface of the package substrate and exposing the clamped package substrate to a heat source includes exposing to a heat source at a temperature suitable to reflow the solder paste.

In Example 12, a package substrate made by any of the methods of Examples 1 or 2.

Example 13 is a method including clamping a integrated circuit package substrate between a first supporting substrate and a second supporting substrate, wherein the package substrate is configured to accept an integrated circuit die in a subsequent die attach process and each of the first supporting substrate and the second supporting substrate include tempered glass; exposing the clamped package substrate to a heat source from a single direction orthogonal to a surface of the package substrate; and modifying a shape of the package substrate.

In Example 14, the package substrate of the method of Example 13 includes a first side including a two-dimensional area and the first supporting substrate is clamped to the first side of the package substrate, the first supporting substrate including a two-dimensional area that is 75 percent to 95 percent of the area of the first side of the package substrate.

In Example 15, the single direction of the heat source of the method of Example 14 is a direction on the side of the first side of the package substrate.

In Example 16, the second supporting substrate of the method of Example 14 includes a two-dimensional area that is at least equivalent to the area of the package substrate.

In Example 17, the first side of the package substrate of the method of Example 13 includes a die area and, prior to modifying the shape, the first side of the package substrate has a convex shape.

In Example 18, modifying the shape of the method of Example 12 includes modifying the convex shape of the first side of the package substrate to a concave shape.

In Example 19, a package substrate made by any of the methods of Examples 13 or 14.

Example 20 is an apparatus including a first supporting substrate and a second supporting substrate each including a material having a coefficient of thermal expansion less than a coefficient of thermal expansion of a material of an integrated circuit package substrate, the first supporting substrate including a two-dimensional area that is 75 percent to 95 percent of the area of the first side of the package substrate and the second supporting substrate including a two-dimensional area that is at least equivalent to the area of a package substrate and each of the first supporting substrate and the second supporting substrate include a body having a cavity therein such that when assembled on opposite sides of a package substrate, each cavity has a volume dimension such that the body of the supporting substrate is not in contact with an active area of a package substrate.

In Example 21, the material for each of the first supporting substrate and the second supporting substrate in the apparatus of Example 20 includes tempered glass.

In Example 22, the tempered glass in the apparatus of Example 21 is polished.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
    clamping an integrated circuit package substrate between a first supporting substrate and a second supporting substrate, wherein the integrated circuit package substrate comprises a core, one or more routing layers insulated by a dielectric material on the core and a plurality of contact points coupled to the one or more routing layers operable for subsequently connecting a die to the integrated circuit package substrate to form a package;
    exposing the clamped integrated circuit package substrate to a heat source from a single direction; and
    modifying a shape of the integrated circuit package substrate.

2. The method of claim 1, wherein the integrated circuit package substrate comprises a first side including a two-dimensional area and the first supporting substrate is clamped to the first side of the integrated circuit package substrate, the first supporting substrate comprising a two-dimensional area that is 75 percent to 95 percent of the area of the first side of the integrated circuit package substrate.

3. The method of claim 2, wherein the single direction of the heat source is a direction on the side of the first side of the integrated circuit package substrate.

4. The method of claim 2, wherein the second supporting substrate comprises a two-dimensional area that is at least equivalent to the area of the integrated circuit package substrate.

5. A method comprising:
    clamping an integrated circuit package substrate between a first supporting substrate and a second supporting substrate; wherein the integrated circuit package substrate comprises a core, one or more routing layers insulated by a dielectric material on the core and a plurality of contact points coupled to the one or more routing layers operable for subsequently connecting a die to the integrated circuit package substrate to form a package;
    exposing the clamped integrated circuit package substrate to a heat source from a single direction; and
    modifying a shape of the integrated circuit package substrate,
    wherein the material of the first supporting substrate and the material of the second supporting substrate is tempered glass.

6. The method of claim 5, wherein the tempered glass is polished.

7. The method of claim 5, wherein a first side of the integrated circuit package substrate comprises a die area and, prior to modifying the shape, the first side of the integrated circuit package substrate has a convex shape.

8. The method of claim 7, wherein modifying the shape comprises modifying the convex shape of the first side of the integrated circuit package substrate to a concave shape.

9. The method of claim 5, wherein the integrated circuit package substrate comprises exposed solder, and the method further comprises exposing the clamped package substrate to a heat source in a reduced oxygen environment.

10. The method of claim 5, wherein the heat source comprises a heat source having a temperature of 180° C. to 250° C.

11. The method of claim 10, wherein prior to exposing the clamped integrated circuit package substrate to a heat source, the method comprises introducing a solder paste on a surface of the integrated circuit package substrate and exposing the clamped integrated circuit package substrate to a heat source comprises exposing to a heat source at a temperature suitable to reflow the solder paste.

12. A method comprising:
   clamping an integrated circuit package substrate between a first supporting substrate and a second supporting substrate, wherein the integrated circuit package substrate comprises a core with one or more routing layers on each side of the core and the package substrate is configured to accept an integrated circuit die in a subsequent die attach process and each of the first supporting substrate and the second supporting substrate comprise tempered glass;
   exposing the clamped integrated circuit package substrate to a heat source from a single direction orthogonal to a surface of the package substrate; and
   modifying a shape of the integrated circuit package substrate.

13. The method of claim 12, wherein the integrated circuit package substrate comprises a first side including a two-dimensional area and the first supporting substrate is clamped to the first side of the integrated circuit package substrate, the first supporting substrate comprising a two-dimensional area that is 75 percent to 95 percent of the area of the first side of the package substrate.

14. The method of claim 13, wherein the single direction of the heat source is a direction on the side of the first side of the integrated circuit package substrate.

15. The method of claim 13, wherein the second supporting substrate comprises a two-dimensional area that is at least equivalent to the area of the integrated circuit package substrate.

16. The method of claim 12, wherein a first side of the integrated circuit package substrate comprises a die area and, prior to modifying the shape, the first side of the integrated circuit package substrate has a convex shape.

17. The method of claim 16, wherein modifying the shape comprises modifying the convex shape of the first side of the integrated circuit package substrate to a concave shape.

18. An apparatus comprising:
   a first supporting substrate and a second supporting substrate each comprising a material having a coefficient of thermal expansion less than a coefficient of thermal expansion of a material of an integrated circuit package substrate, the first supporting substrate comprising a two-dimensional area that is 75 percent to 95 percent of the area of the first side of the package substrate and the second supporting substrate comprising a two-dimensional area that is at least equivalent to the area of a package substrate and each of the first supporting substrate and the second supporting substrate comprise a body having a cavity therein such that when assembled on opposite sides of a package substrate, each cavity has a volume dimension such that the body of the supporting substrate is not in contact with an active area of a package substrate.

19. The apparatus of claim 18, wherein the material for each of the first supporting substrate and the second supporting substrate comprises tempered glass.

20. The apparatus of claim 19, wherein the tempered glass is polished.

* * * * *